United States Patent
Gémesi

(10) Patent No.: US 10,236,812 B2
(45) Date of Patent: Mar. 19, 2019

(54) STRAY MAGNETIC FIELD COMPENSATION FOR A ROTOR POSITION SENSOR

(71) Applicants: THYSSENKRUPP PRESTA AG, Eschen (LI); thyssenkrupp AG, Essen (DE)

(72) Inventor: Roland Gémesi, Dunakeszi (HU)

(73) Assignees: THYSSENKRUPP PRESTA AG, Eschen (LI); THYSSENKRUPP AG, Essen (DE)

( * ) Notice: Subject to any disclaimer, the term of this patent is extended or adjusted under 35 U.S.C. 154(b) by 0 days.

(21) Appl. No.: 15/771,672

(22) PCT Filed: Dec. 2, 2015

(86) PCT No.: PCT/EP2015/078336
§ 371 (c)(1),
(2) Date: Apr. 27, 2018

(87) PCT Pub. No.: WO2017/092799
PCT Pub. Date: Jun. 8, 2017

(65) Prior Publication Data
US 2018/0323738 A1    Nov. 8, 2018

(51) Int. Cl.
*H02P 21/06* (2016.01)
*H02P 6/08* (2016.01)
(Continued)

(52) U.S. Cl.
CPC .............. *H02P 21/06* (2013.01); *B62D 5/046* (2013.01); *G01R 33/0041* (2013.01);
(Continued)

(58) Field of Classification Search
CPC ................................ H02P 21/06; H02P 21/50
(Continued)

(56) References Cited

U.S. PATENT DOCUMENTS

| 8,541,965 B2 * | 9/2013 | Ueda ..................... B62D 5/046 |
| | | 318/400.02 |
| 2003/0057913 A1 | 3/2003 | Matsushita |

(Continued)

FOREIGN PATENT DOCUMENTS

| CN | 103199788 B | 7/2013 |
| DE | 102008043265 A | 5/2010 |

OTHER PUBLICATIONS

The International Search Report issued in PCT/EP2015/078336, dated Jul. 22, 2016 (dated Aug. 2, 2016).

*Primary Examiner* — David Luo
(74) *Attorney, Agent, or Firm* — thyssenkrupp North America, Inc.

(57) ABSTRACT

A method may be used to error compensate a measurement of an electric motor's rotor position in a power steering system of a motor vehicle. The electric motor generates torque for assisting steering of the motor vehicle, and stray magnetic fields of motor currents affect the measurement of the rotor position with a magneto-resistive rotor position sensor. The method may involve calculating at least two compensation values based on a current vector, rotor position, and hardware dependent parameters. The at least two compensation values account for errors in the rotor position measurement due to stray magnetic fields of motor currents. The method may also involve calculating a compensated rotor position signal by subtracting the at least two compensation values of the measured rotor position, as well as transferring the compensated rotor position signal as part of a feed-back loop to a target motor torque determination in the motor control.

9 Claims, 3 Drawing Sheets

(51) Int. Cl.
*B62D 5/04* (2006.01)
*G01R 33/00* (2006.01)
*H02P 21/00* (2016.01)

(52) U.S. Cl.
CPC ............ *G01R 33/0082* (2013.01); *H02P 6/08* (2013.01); *H02P 21/50* (2016.02)

(58) Field of Classification Search
USPC ............................... 318/400.02, 400.01, 700
See application file for complete search history.

(56) References Cited

U.S. PATENT DOCUMENTS

2005/0278137 A1    12/2005  Hammerschmidt
2014/0225597 A1     8/2014  Romero

\* cited by examiner

STRAY MAGNETIC FIELD COMPENSATION FOR A ROTOR POSITION SENSOR

CROSS REFERENCE TO RELATED APPLICATION

This application is a U.S. National Stage Entry of International Patent Application Serial Number PCT/EP2015/078336, filed Dec. 2, 2015, the entire content of which is incorporated herein by reference.

FIELD

The present disclosure generally relates to electromechanical motor vehicle power steering mechanisms and to error compensation, including error compensation in measurements of an electric motor's rotor position in a power steering system.

BACKGROUND

In an electric power steering apparatus the steering assist force is applied to a steering mechanism by driving an electric motor in accordance with steering torque that is applied to a steering wheel by a driver. An electronic control unit with an inverter controls the motor. The inverter feeds the motor controller with motor parameters for torque generation. The control system of synchronous motors needs position feedback in order to calculate the phase currents necessary for obtaining the desired torque with maximum efficiency.

For the detecting of rotor position mostly magneto-resistive sensors are used. A sensor chip detects the magnetic field of a permanent magnet, which is preferably round in form and mounted coaxially on a rotating shaft. This configuration is only applicable fulfilling the geometrical preconditions at a free rotor side of the electric drive. That is why this arrangement is called end of shaft (EOS). The sensors are negatively affected by a stray magnetic field caused by high motor currents, leading to undesired noises and loss of rotor position measurement accuracy. Hardware design best practices have evolved to minimize the disturbing effects but other system design constraints often prevent following them. To have a better understanding of the achieved rotor position sensor (RPS) accuracy, various measurement methods have been proposed. Hardware and software filtering are already applied to suppress higher frequency noise components and to compensate for the effect of measurement delays.

DE 10 2008 043 265 A1 discloses a method for failure compensation of electric angle measurements. The magnetic interference field, which influences the magnetic field, is decomposed into single interference vectors. After that the magnetic interference field is vectorially subtracted from a detected magnetic field vector. The determination of the vector components of the measured magnetic field involves a high calculation effort. One disadvantage of the described state of the art is that the interference compensation is based on the usage of several look-up tables, which leads to a retarded detection of compensation parameters.

Thus a need exists for an improved method for rotor position measurements in power steering systems of motor vehicles by reducing the influence of stray magnetic fields without affecting the electric motor performance. Further, a reduction of undesired noises is needed.

DETAILED DESCRIPTION

Figure 1:
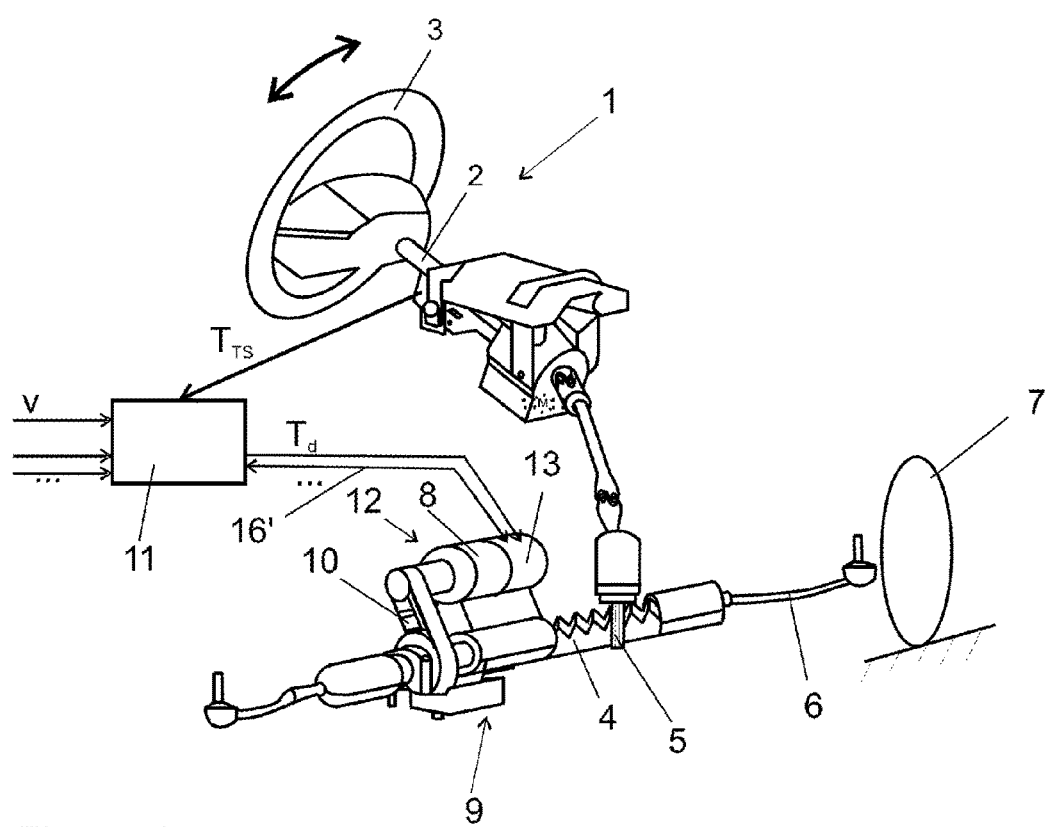
FIG. 1 is a schematic view of an example electromechanical power steering mechanism.

Although certain example methods and apparatus have been described herein, the scope of coverage of this patent is not limited thereto. On the contrary, this patent covers all methods, apparatus, and articles of manufacture fairly falling within the scope of the appended claims either literally or under the doctrine of equivalents. Moreover, those having ordinary skill in the art will understand that reciting 'a' element or 'an' element in the appended claims does not restrict those claims to articles, apparatuses, systems, methods, or the like having only one of that element, even where other elements in the same claim or different claims are preceded by 'at least one' or similar language. Similarly, it should be understood that the steps of any method claims need not necessarily be performed in the order in which they are recited, unless so required by the context of the claims. In addition, all references to one skilled in the art shall be understood to refer to one having ordinary skill in the art.

The present disclosure generally relates to methods for error compensation in measurements of an electric motor's rotor position in a power steering system of a motor vehicle and to an electromechanical motor vehicle power steering mechanisms.

Methods for error compensation may be used in a measurement of an electric motor's rotor position in a power steering system of a motor vehicle. In some examples, the electric motor generates a torque for assisting steering of the motor vehicle. Further, stray magnetic fields of electric motor currents may affect the measurement of the rotor position with a rotor position sensor. Hence, some example methods may comprise the following steps:

Measuring the rotor position with the rotor position sensor,

Determining a target motor torque based on signals representative of at least the vehicle velocity and the torque applied to a steering wheel, Transferring the target motor torque into target voltages, Transforming the target voltages into a current vector in the rotating reference frame fixed to the rotor of the electric motor, Transforming the current vector into motor currents expressed in a coordinate system fixed to the stator of the electric motor, Calculating at least two compensation values based on the current vector or a current vector which is transformed from motor currents into a coordinate system fixed to the rotor, the rotor position and hardware dependent parameters, wherein the at least two compensation values accounts for errors in the rotor position measurement due to stray magnetic fields of motor currents, Calculating a compensated rotor position signal by subtracting the at least two compensation values from the measured rotor position, and Transferring the compensated rotor position signal as part of a feed-back loop to the target motor torque determination.

This method improves the accuracy of rotor position measurements and reduces undesired noises by eliminating the influences of stray magnetic fields without affecting the motor performance. The compensation is done straightforward by calculation of an error angle and subtraction of that error angle form the measured rotor angle. Further, advantageous embodiments can be taken from the dependent claims.

A preferred error compensation method includes the following steps:

Measuring the rotor position with the rotor position sensor,

Determining a target motor torque based on signals representative of at least the vehicle velocity and the torque applied to a steering wheel, Transferring the target motor torque into target voltages, Transforming the target voltages into a motor current value expressed in a coordinate system fixed to the stator of the electric motor, Transforming the motor current value into a current vector in the rotating reference frame fixed to the rotor of the electric motor and Calculating at least two compensation values based on the current vector, the rotor position and hardware dependent parameters, wherein the at least two compensation values accounts for errors in the rotor position measurement due to stray magnetic fields of motor currents, Calculating a compensated rotor position signal by subtracting the at least two compensation values from the measured rotor position, and Transferring the compensated rotor position signal as part of a feed-back loop to the target motor torque determination.

The preferred method works with high reliability at high dynamics and the compensation can be realized much faster by using the motor current value.

Advantageously, the at least two compensation values are given for a respective harmonic of the measured rotor position by a trigonometric function of the rotor position, wherein the amplitude is dependent on the length of the current vector, the phase shift is dependent on the angle of the current vector and the periodic length is proportional to the number of the respective harmonic.

The phase shift may include an electrical offset. Further it is preferred, that the amplitude is dependent on a parameter, which accounts for the error in the measurement of the rotor position due to stray magnetic fields of electric motor currents and which is linearly dependent on the current vector. Advantageously, this parameter is stored in a steering controller or in a look-up table. The parameter's dependency on the electric motor current is preferably constant for a given hardware design of the power steering system. Thus, the parameter can be determined beforehand, which reduces the calculation effort.

It was determined that the noise caused by high motor currents mainly appears as harmonics XB and XA of the rotor position signal. Preferably, the harmonic XA=P+1 and the harmonic XB=P−1, wherein P is the number of motor pole pairs of the electric motor. In a preferred embodiment, two compensation values are calculated, which account for the XB and XA harmonics.

Further an electromechanical motor vehicle power steering mechanism for assisting steering of a motor vehicle by conferring torque generated by an electric motor to a steering mechanism, is provided, the mechanism comprising:

a rotor position sensor which measures the electric motor's rotor position, a steering controller which receives signals representative of at least the vehicle velocity and the torque applied to a steering wheel to determine a target motor torque, a motor controller which receives the target motor torque from the steering controller and transfers it into target voltages, an inverter which transforms the target voltages into currents in the rotating reference frame fixed to the rotor of the electric motor, a coordinate transformation which transforms the currents into motor currents expressed in a coordinate system fixed to the stator of the electric motor, and a compensation unit which calculates a compensated rotor position signal based on the currents or a current vector which is transformed from motor currents into a coordinate system fixed to the rotor, the rotor position signal and hardware dependent parameters, wherein the compensation accounts for errors in the rotor position measurement due to stray magnetic fields of motor currents and which transfers the compensated rotor position signal to the steering controller. The features and advantages mentioned above with respect to the compensation also apply to the electromechanical motor vehicle power steering mechanism.

In a preferred embodiment the mechanism comprises:

a rotor position sensor which measures the electric motor's rotor position, a steering controller which receives signals representative of at least the vehicle velocity and the torque applied to a steering wheel to determine a target motor torque, a motor controller which receives the target motor torque from the steering controller and transfers it into target voltages, an inverter which transforms the target voltages into motor currents expressed in a coordinate system fixed to the stator of the electric motor, a coordinate transformation which transforms the currents into currents in the rotating reference frame fixed to the rotor of the electric motor, and a compensation unit which calculates a compensated rotor position signal based on the currents, the rotor position signal and hardware dependent parameters, wherein the compensation accounts for errors in the rotor position measurement due to stray magnetic fields of motor currents and which transfers the compensated rotor position signal to the steering controller. The features and advantages mentioned above with respect to the compensation also apply to the electromechanical motor vehicle power steering mechanism.

The preferred method works with high reliability at high dynamics and the compensation can be realized much faster by using the motor current value.

An electromechanical power steering mechanism 1 is schematically illustrated in FIG. 1 with a steering shaft 2 connected to a steering wheel 3 for operation by the driver. The steering shaft 2 is coupled to a steering rack 4 via a gear pinion 5. Steering track rods 6 are connected to the steering rack 4 and to steered wheels 7 of the motor vehicle. A rotation of the steering shaft 2 causes an axial displacement of the steering rack 4 by means of the gear pinion 5 which is connected to the steering shaft 2 in a torque-proof manner. To provide steering assistance, an electric motor 8 mounted to the side of the rack housing drives a ball-screw mechanism 9 via a toothed rubber belt 10. The electric motor 8 is a permanent magnet-excited synchronous motor. Electric power assist is provided through a steering controller 11 and a power assist actuator 12 comprising the electric motor 8 and a motor controller 13. The steering controller 11 in the example receives signals representative of the vehicle velocity v and the torque $T_{TS}$ applied to the steering wheel by the vehicle operator. In addition, as the rotor of the electric motor 8 turns, rotor position signals are generated within the electric motor 8. These rotor position signals are compensated for stray magnetic fields of motor currents before they are provided to the steering controller 11. In response to the vehicle velocity v, the operator torque $T_{TS}$ and the compensated rotor position signal 16', the controller 11 determines the target motor torque $T_d$ and provides the signal through to the motor controller 13, where the motor currents are calculated via PWM (pulse-width modulation).

Figure 2A:
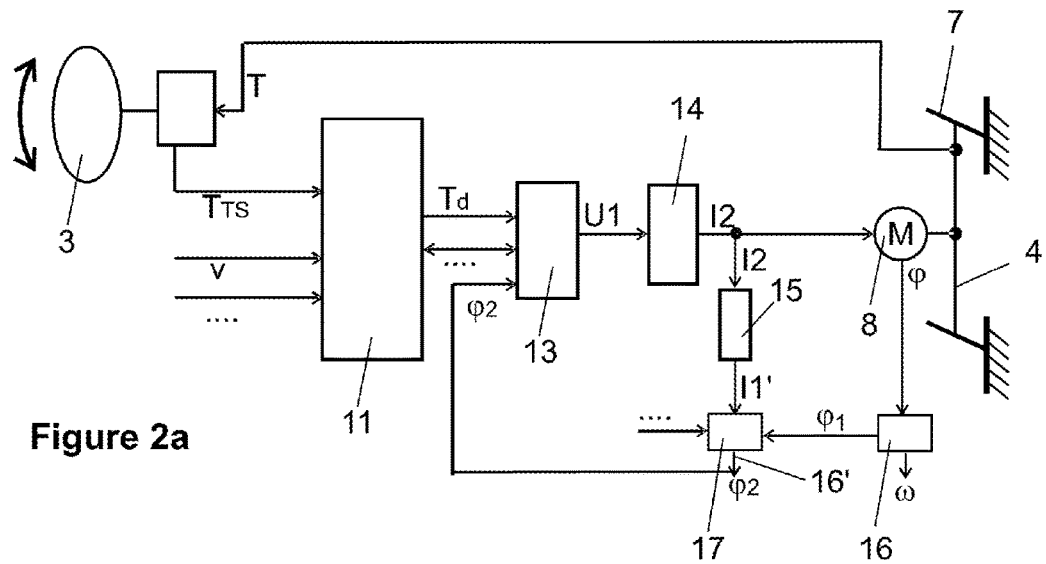
FIG. 2a is a block diagram showing an example electrical structure of an electric power steering apparatus.
Figure 2B:
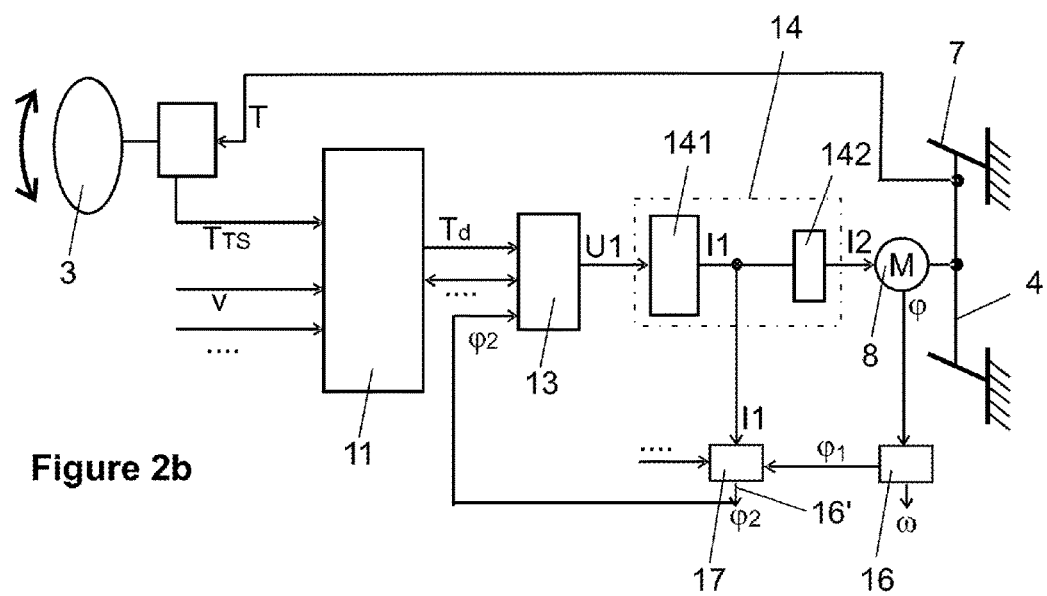
FIG. 2b is block diagram showing another example electrical structure of an electric power steering apparatus.

FIG. 2a and FIG. 2b show a block diagram of the electrical structure of the electric power steering apparatus. A preferred embodiment of the invention is shown in FIG. 2a. The steering controller 11 receives signals representative of the vehicle velocity v and the torque $T_{TS}$ applied to the steering wheel 3 by the vehicle operator and determines the target motor torque $T_d$. This torque $T_d$ is fed to the motor controller 13, which determines the voltage input U1=Uα, Uβ for the PWM. An inverter 14 generates the motor currents $I_U$, $I_V$, $I_W$=I2 in the three-dimensional coordinate system which are fed into the motor 8. By using the motor currents I2 the compensation works with high reliability at high dynamics and can be realized much faster.

In FIG. 2b the inverter 14 transforms in the unit 141 the voltage input U1 of the motor controller 13 into a current vector I1=Iq, Id in the rotating reference frame fixed to the rotor 19 and via a coordinate transformation 142 into the three-dimensional coordinate system of the motor 8. The motor currents $I_U$, $I_V$, $I_W$=I2 are outputted. Hence, the motor 8 generates a torque T which is correlated to the operator torque $T_{TS}$.

A rotor position sensor (RPS) 16 measures the motor's rotor position angle φ1, which is transferred into a compensation unit 17. Preferably, the RPS is a magnetic or a magneto-resistive sensor with an end of shaft arrangement of the magnet. Based on the input parameters I1'=Id,Iq, shown in FIG. 2a, or I1=Id,Iq, shown in FIG. 2b, φ1, XA, XB and the amplitude and phase parameters of the harmonics of the motor current, the compensation unit 17 calculates the compensation values $Comp_{XB}$,$Comp_{XA}$. As shown in FIG. 2a the current vector I1' is obtained via a coordinate transformation 15 of the motor currents I2=$I_U$, $I_V$, $I_W$ into the rotating reference frame (d-q) fixed to the rotor 19 of the electric motor 8. In an preferred embodiment the harmonic XA=P+1 and the harmonic XB=P−1, wherein P is the number of motor pole pairs. In other words the harmonic XA is of P+1 order and the harmonic XB is of P−1 order. For the resulting compensated rotor position angle φ2 the compensation values $Comp_{P-1}$,$Comp_{P+1}$ are subtracted from the measured rotor position angle φ1. The resulting and corrected compensated rotor position angle φ2 is then used in the motor's feedback loop and is fed into the motor controller 13.

The influence of stray magnetic fields on the rotor position angle measurement is expressed in the compensation values $Comp_{XB}$,$Comp_{XA}$. Stray magnetic fields are very dependent on many factors, e.g. the design of rotor and/or stator and the design of the motor housing including the numbers of screws and other likewise design topics.

The number of motor coils is an essential influence on the stray field. It has been identified that the noise caused by high motor currents mainly appears as motor current harmonics P−1 and P+1, wherein P is the number of motor pole pairs. For example in case of a motor with four pole pairs, a significant disturbance appears in third and fifth order, where the rotor position angle error linearly depends on the applied motor current.

The parameters of the compensation functions apart from the current and the measured rotor signal are constants which can be identified for a given hardware design. These parameters do not show piece-by-piece dependency.

In order to characterise the hardware design and determine the compensation functions with their parameters, at first a Fast Fourier Transformation (FFT) of the RPS signal for different current values (e.g. 0 A, 40 A, 80 A, 120 A) is carried out and compared to reference values to find relevant harmonics of motor current, which cause the stray magnetic fields. This determination can be done with comparison of the measured RPS signal to a signal of reference sensors or by keeping the rotor fixed and direct measurement of the stray magnetic field influence on the RPS signal. Other harmonics than the P−1 and P+1 harmonics can be relevant and would be detected. The detection of the stray magnetic field is done only once and is applicable to all other steering systems with the same hardware design.

Then high current values are set which account for the disturbances in the third and fifth order in the FFT. Here the amplitude and the phase shifting are also determined. The amplitudes of the harmonics depend on the length of the current vector (Id,Iq) in the rotating reference frame (d-q) fixed to the rotor of the motor 8. The phases of the harmonics are dependent on the angle of the current vector (Id,Iq). The disturbance of currents is proportional to the motor currents (Id,Iq). It rotates P times faster than the RPS-magnet and is offset by an electrical offset. The compensation values $Comp_{XB}$,$Comp_{XA}$ are then calculated by the amplitude multiplied by the cosine of a given angle times the number of the respective harmonic corrected by a phase shift given by the phase of the respective harmonic and the electrical offset. Finally, the compensation values $Comp_{XB}$,$Comp_{XA}$ are both subtracted from the measured rotor position angle φ1 to correct for the influences of the stray magnetic field. The stray magnetic field compensation is expressed as, $$Comp_{XA} = APC\sqrt{Id^2 + Iq^2} * \cos\left(\varphi 1 * (XA) - \varphi_{eloffset} - \varphi_{XA} - \tan^{-1}\frac{Iq}{Id}\right)$$

$$Comp_{XB} = APC\sqrt{Id^2 + Iq^2} * \cos\left(\varphi 1 * (XB) - \varphi_{eloffset} - \varphi_{XB} - \tan^{-1}\frac{Iq}{Id}\right)$$

with
φ2=φ1−$Comp_{XA}$−$Comp_{XB}$, and wherein APC is a constant and φeloffset accounts for an electrical offset.

Figure 3:
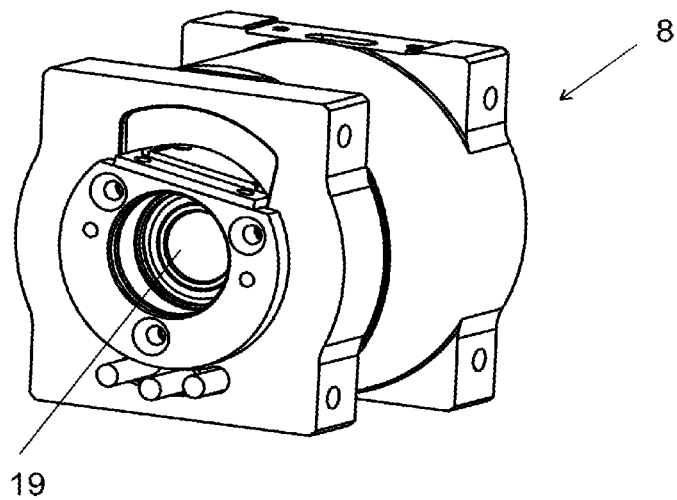
FIG. 3 is a perspective view of an example electric motor of an electromechanical power steering mechanism.
Figure 4:
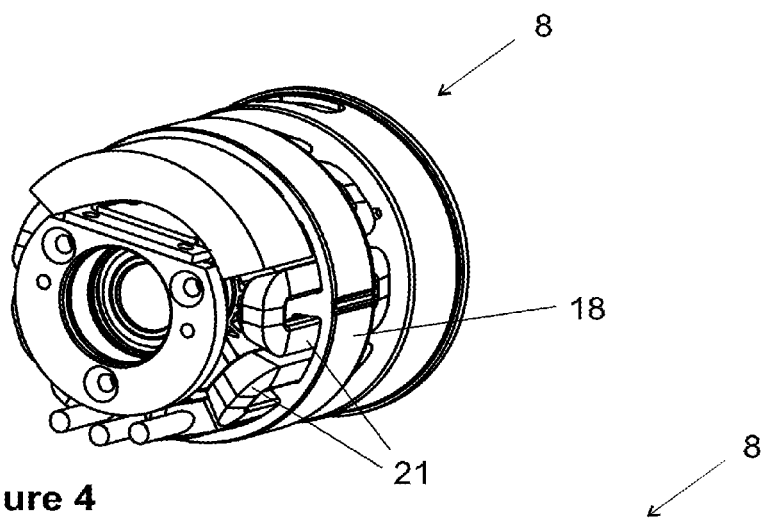
FIG. 4 is a perspective view of the example electric motor of FIG. 4.
Figure 5:
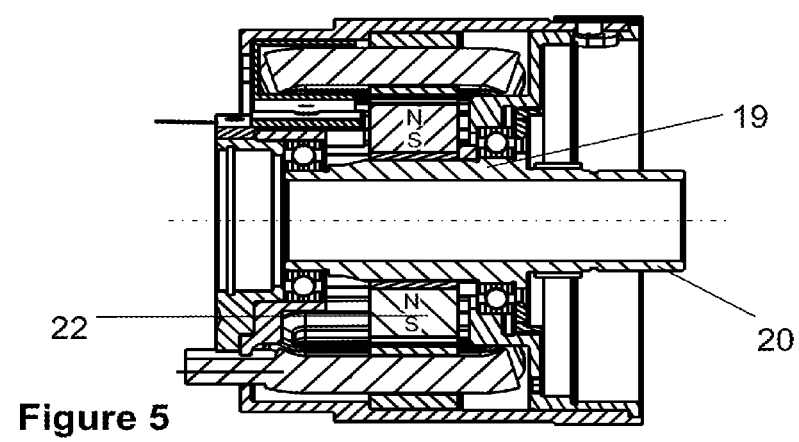
FIG. 5 is a longitudinal sectional view of the electric motor of FIG. 4.

FIGS. 3 to 5 show an electric motor 8. The electric motor 8 has a stator 18 and a rotor 19 with a rotor shaft 20. Three-phase AC voltage is applied to the windings 21 of the stator 18 and a rotating magnetic field is produced. The rotor 19 has three pole pairs 22 and is attracted or driven by the rotating stator field. This attraction exerts a torque on the rotor 19 and causes it to rotate at the synchronous speed of the rotating stator field. Rotor position of the electric motor 8 is measured with an RPS.

The present invention provides an electromechanical motor vehicle power steering mechanism with an improved method for rotor position measurement by reducing the influence of stray magnetic fields of high motor currents without affecting the engine performance. Further undesired noises due to the stray magnetic field can be decreased or even eliminated. The invention is not limited to a specific number of motor pole pairs or even in general to a specific electric motor design. It is further applicable to any RPS, which works based on a magnetic principle.

What is claimed is:

1. A method for error compensating a measurement of a position of a rotor of an electric motor in a power steering system of a motor vehicle, wherein the electric motor generates torque for assisting steering of the motor vehicle, wherein stray magnetic fields of electric motor currents affect the measurement of the rotor position by a rotor position sensor, the method comprising:
   measuring the rotor position with the rotor position sensor;
   determining a target motor torque based on signals representative of at least a vehicle velocity and a torque applied to a steering wheel;
   transferring the target motor torque into target voltages;
   transforming the target voltages into a current vector in a rotating reference frame fixed to the rotor of the electric motor;
   transforming the current vector into motor currents expressed in a coordinate system fixed to a stator of the electric motor;
   calculating at least two compensation values based on the current vector or a current vector transformed from the motor currents into a coordinate system fixed to the rotor, based on the rotor position, and based on hardware dependent parameters, wherein the at least two compensation values account for errors in the measured rotor position due to the stray magnetic fields of electric motor currents;
   calculating a compensated rotor position signal by subtracting the at least two compensation values of the measured rotor position; and
   transferring the compensated rotor position signal as part of a feedback loop to the determination of the target motor torque.

2. The method of claim 1 wherein the at least two compensation values are each given for a respective harmonic by a trigonometric function of the rotor position, wherein an amplitude is dependent on a length of the current vector, a phase shift is dependent on an angle of the current vector, and a periodic length is proportional to a number of the respective harmonic.

3. The method of claim 2 wherein the phase shift includes an electrical offset.

4. The method of claim 2 wherein the amplitude is dependent on a parameter that accounts for the error in the measured rotor position due to the stray magnetic fields of electrical motor currents and that is linearly dependent on the current vector.

5. The method of claim 4 wherein the parameter on which the amplitude depends is stored in a look-up table.

6. The method of claim 4 wherein the parameter's linear dependence on the current vector is constant for a given hardware design of the power steering system.

7. The method of claim 1 wherein the at least two compensation values account for XB and XA harmonics of the compensated rotor position signal.

8. The method of claim 1 wherein the XA harmonic=P+1 and the XB harmonic=P−1, wherein P is a number of motor pole pairs of the electric motor.

9. An electromechanical motor vehicle power steering mechanism for assisting steering of a motor vehicle by conferring torque generated by an electric motor to a steering mechanism, the electromechanical motor vehicle power steering mechanism comprising:
   a magneto-resistive rotor position sensor that measures a position of a rotor of the electric motor;
   a steering controller that receives signals representative of at least a vehicle velocity and a torque applied to a steering wheel to determine a target motor torque;
   a motor controller that receives the target motor torque from the steering controller and transfers the target motor torque into target voltages;
   an inverter that transforms the target voltages into currents in a rotating reference frame fixed to the rotor of the electric motor;
   a coordinate transformation that transforms the currents into motor currents expressed in a coordinate system fixed to a stator of the electric motor; and
   a compensation unit that calculates a compensated rotor position signal based on the currents or a current vector transformed from the motor currents into a coordinate system fixed to the rotor, based on the rotor position, and based on hardware dependent parameters, wherein the compensated rotor position signal accounts for errors in the measured rotor position due to stray magnetic fields of motor currents, the compensation unit transferring the compensated rotor position signal to the steering controller.

* * * * *